(12) United States Patent
Engl et al.

(10) Patent No.: US 10,014,444 B2
(45) Date of Patent: *Jul. 3, 2018

(54) OPTOELECTRONIC SEMICONDUCTOR CHIP

(71) Applicant: OSRAM Opto Semiconductors GmbH, Regensburg (DE)

(72) Inventors: Karl Engl, Pentling (DE); Georg Hartung, Nesselwang (DE); Johann Eibl, Wald (DE); Michael Huber, Bad Abbach (DE); Markus Maute, Alteglofsheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/905,763

(22) PCT Filed: Jun. 25, 2014

(86) PCT No.: PCT/EP2014/063423
§ 371 (c)(1),
(2) Date: Jan. 15, 2016

(87) PCT Pub. No.: WO2015/007486
PCT Pub. Date: Jan. 22, 2015

(65) Prior Publication Data
US 2016/0172545 A1   Jun. 16, 2016

(30) Foreign Application Priority Data
Jul. 16, 2013  (DE) .................. 10 2013 107 531

(51) Int. Cl.
*H01L 33/00* (2010.01)
*H01L 33/46* (2010.01)
(Continued)

(52) U.S. Cl.
CPC .............. *H01L 33/46* (2013.01); *H01L 33/44* (2013.01); *H01L 33/505* (2013.01); *H01L 33/62* (2013.01);
(Continued)

(58) Field of Classification Search
CPC ..... H01L 33/382; H01L 33/46; H01L 33/505; H01L 33/54; H01L 33/62
(Continued)

(56) References Cited

U.S. PATENT DOCUMENTS 6,008,525 A * 12/1999 Barron ................ H01L 29/7371
257/279
6,614,172 B2 * 9/2003 Chiu ....................... H01L 33/22
257/100
(Continued)

FOREIGN PATENT DOCUMENTS

CN   101796656 A   8/2010
CN   105308762 A   2/2016
(Continued)

*Primary Examiner* — Jay C Kim
(74) *Attorney, Agent, or Firm* — Slater Matsil, LLP

(57) ABSTRACT

An optoelectronic semi-conductor chip is disclosed in which an encapsulation layer, which is an ALD layer, completely covers a first mirror layer on the side thereof facing away from a p-conductive region, and is arranged to be in direct contact with said first mirror layer in some sections.

19 Claims, 14 Drawing Sheets

(51) Int. Cl.
*H01L 33/44* (2010.01)
*H01L 33/50* (2010.01)
*H01L 33/62* (2010.01)
H01L 33/22 (2010.01)
H01L 33/38 (2010.01)
H01L 33/40 (2010.01)

(52) U.S. Cl.
CPC .......... *H01L 33/0079* (2013.01); *H01L 33/22* (2013.01); *H01L 33/382* (2013.01); *H01L 33/405* (2013.01); *H01L 2933/0025* (2013.01)

(58) Field of Classification Search
USPC ........................................................ 257/98
See application file for complete search history.

(56) References Cited

U.S. PATENT DOCUMENTS

| | | | | |
|---|---|---|---|---|
| 6,630,689 B2* | 10/2003 | Bhat | ........................ | H01L 33/20 257/79 |
| 6,642,652 B2* | 11/2003 | Collins, III | .......... | H01L 33/505 313/498 |
| 6,828,596 B2* | 12/2004 | Steigerwald | ............ | H01L 33/08 257/88 |
| 6,841,802 B2* | 1/2005 | Yoo | ........................ | H01L 33/44 257/81 |
| 6,891,197 B2* | 5/2005 | Bhat | ........................ | H01L 33/20 257/79 |
| 6,891,871 B1* | 5/2005 | Nomura | ................. | B82Y 20/00 372/45.01 |
| 6,964,877 B2* | 11/2005 | Chen | ...................... | H01L 24/97 438/106 |
| 7,141,825 B2 | 11/2006 | Horio et al. | | |
| 7,148,514 B2* | 12/2006 | Seo | ........................ | H01L 33/46 257/103 |
| 7,388,232 B2* | 6/2008 | Suehiro | .................. | H01L 33/44 257/103 |
| 7,414,271 B2* | 8/2008 | Jeon | ..................... | H01L 33/507 257/89 |
| 7,420,218 B2* | 9/2008 | Nagai | ................. | H01L 33/0079 257/100 |
| 7,646,036 B2* | 1/2010 | Kozawa | ................ | H01L 33/405 257/99 |
| 7,679,097 B2* | 3/2010 | Akaishi | ................... | H01L 33/38 257/79 |
| 7,732,231 B1* | 6/2010 | Aldaz | ..................... | H01L 33/38 438/22 |
| 7,880,177 B2* | 2/2011 | Takeuchi | ........... | H01L 33/0079 257/79 |
| 7,928,464 B2* | 4/2011 | Lee | .................... | H01L 33/0079 257/99 |
| 7,939,838 B2* | 5/2011 | Tanaka | .................... | H01L 33/46 257/79 |
| 7,939,844 B2 | 5/2011 | Hahn et al. | | |
| 7,968,355 B2* | 6/2011 | Kim | .................... | H01L 33/0079 257/E21.527 |
| 7,973,329 B2* | 7/2011 | Lee | ........................ | H01L 33/44 257/81 |
| 7,977,686 B2* | 7/2011 | Ibbetson | ............... | H01L 33/486 257/100 |
| 7,994,514 B2* | 8/2011 | Bhat | ........................ | H01L 27/15 257/79 |
| 8,062,925 B2* | 11/2011 | Shchekin | ................ | H01L 33/44 257/E21.527 |
| 8,138,516 B2* | 3/2012 | Unno | ................... | H01L 33/382 257/103 |
| 8,232,577 B2* | 7/2012 | Jeong | ................... | H01L 33/405 257/183 |
| 8,241,932 B1* | 8/2012 | Yu | ....................... | H01L 25/0753 257/E21.122 |
| 8,258,533 B2* | 9/2012 | Seo | ....................... | H01L 25/0753 257/100 |
| 8,278,681 B2* | 10/2012 | Lee | ......................... | H01L 24/26 257/100 |
| 8,288,781 B2* | 10/2012 | Seo | ....................... | H01L 27/156 257/88 |
| 8,294,182 B2* | 10/2012 | Jeong | ..................... | H01L 27/15 257/199 |
| 8,324,649 B2* | 12/2012 | Lee | ........................ | H01L 33/382 257/98 |
| 8,344,397 B2* | 1/2013 | Lerman | ................ | H01L 25/0753 257/88 |
| 8,350,285 B2* | 1/2013 | Sugizaki | ............ | H01L 33/0095 257/98 |
| 8,367,438 B2* | 2/2013 | Plößl | ................ | H01L 33/0079 257/100 |
| 8,384,112 B2* | 2/2013 | Tsang | ..................... | H01L 33/025 257/98 |
| 8,421,112 B2* | 4/2013 | Jeong | ..................... | H01L 33/44 257/91 |
| 8,450,751 B2* | 5/2013 | Engl | ....................... | H01L 33/382 257/774 |
| 8,476,644 B2* | 7/2013 | Illek | ...................... | H01L 33/382 257/79 |
| 8,497,146 B2* | 7/2013 | Odnoblyudov | ..... | H01L 33/0079 257/E31.124 |
| 8,592,827 B2* | 11/2013 | Huang | ..................... | H01L 27/153 257/79 |
| 8,637,886 B2* | 1/2014 | Tsuji | ..................... | H01L 33/405 257/100 |
| 8,653,542 B2* | 2/2014 | Hsia | .................... | H01L 33/0095 257/88 |
| 8,686,429 B2* | 4/2014 | Bergmann | ............ | H01L 33/405 257/76 |
| 8,698,178 B2 | 4/2014 | Höppel et al. | | |
| 8,716,732 B2* | 5/2014 | Kamiya | ................. | H01L 33/382 257/15 |
| 8,723,206 B2* | 5/2014 | Onushkin | ............. | H01L 33/382 257/98 |
| 8,759,125 B2* | 6/2014 | Tischler | .................. | H01L 33/50 257/89 |
| 8,766,287 B2* | 7/2014 | Moon | ................... | H01L 33/382 257/88 |
| 8,772,805 B2* | 7/2014 | Ye | ........................... | H01L 33/20 257/100 |
| 8,809,893 B2* | 8/2014 | Choi | ....................... | H01L 33/54 136/252 |
| 8,829,554 B2* | 9/2014 | Song | .................. | H01L 33/0079 257/98 |
| 8,872,209 B2* | 10/2014 | Maute | .................... | H01L 33/382 257/79 |
| 8,928,017 B2* | 1/2015 | Chae | ...................... | H01L 33/382 257/103 |
| 8,952,416 B2* | 2/2015 | Jeong | .................... | H01L 33/145 257/99 |
| 8,963,175 B2* | 2/2015 | Onushkin | ............... | H01L 33/08 257/93 |
| 8,969,897 B2* | 3/2015 | Choi | .................... | H01L 33/382 257/98 |
| 9,048,368 B2* | 6/2015 | Jeong | ................. | H01L 33/08 |
| 9,070,837 B2* | 6/2015 | Katsuno | ............. | H01L 33/38 |
| 9,070,851 B2* | 6/2015 | Seo | ................ | H01L 27/153 |
| 9,076,941 B2 | 7/2015 | Herrmann et al. | | |
| 9,082,931 B2* | 7/2015 | Katsuno | ................ | H01L 33/62 |
| 9,082,932 B2* | 7/2015 | von Malm | .......... | H01L 25/0753 |
| 9,099,610 B2* | 8/2015 | Moon | ...................... | H01L 33/02 |
| 9,166,111 B2* | 10/2015 | Matsui | .................. | H01L 33/382 |
| 9,196,807 B2* | 11/2015 | Matsumura | ........... | H01L 33/382 |
| 9,246,061 B2* | 1/2016 | Lei | ....................... | H01L 25/167 |
| 9,257,481 B2* | 2/2016 | Yang | ...................... | H01L 27/153 |
| 9,263,655 B2* | 2/2016 | Hoeppel | ............ | H01L 31/02005 |
| 9,269,873 B2* | 2/2016 | Imazu | .................... | H01L 33/50 |
| 9,276,167 B2* | 3/2016 | Hoppel | ................... | H01L 33/20 |
| 9,293,661 B2* | 3/2016 | Hoppel | ............ | H01L 23/49827 |
| 9,362,335 B2* | 6/2016 | Von Malm | .......... | H01L 27/156 |
| 9,368,428 B2* | 6/2016 | Chitnis | ................ | H01L 23/481 |
| 9,444,013 B2* | 9/2016 | Shimada | .............. | H01L 33/007 |
| 9,530,937 B2* | 12/2016 | Jeong | ................... | H01L 33/405 |
| 9,634,191 B2* | 4/2017 | Keller | ................... | H01L 33/385 |

(56) References Cited

U.S. PATENT DOCUMENTS

| | | | |
|---|---|---|---|
| 9,653,667 B2* | 5/2017 | Jeong | H01L 33/62 |
| 9,728,676 B2* | 8/2017 | Haberern | H01L 33/08 |
| 2005/0233484 A1* | 10/2005 | Stein | H01L 33/44 438/22 |
| 2006/0081858 A1* | 4/2006 | Lin | H01L 33/46 257/85 |
| 2008/0308832 A1* | 12/2008 | Hsieh | H01L 33/44 257/98 |
| 2009/0283787 A1* | 11/2009 | Donofrio | H01L 33/405 257/98 |
| 2009/0294784 A1* | 12/2009 | Nakahara | H01L 33/20 257/98 |
| 2010/0078670 A1* | 4/2010 | Kim | H01L 33/46 257/98 |
| 2010/0171135 A1* | 7/2010 | Engl | H01L 33/382 257/98 |
| 2010/0171215 A1* | 7/2010 | Fischer | H01L 21/561 257/734 |
| 2011/0049537 A1* | 3/2011 | Lee | H01L 25/0753 257/88 |
| 2011/0186892 A1* | 8/2011 | Jeong | H01L 33/0079 257/98 |
| 2011/0193123 A1* | 8/2011 | Moon | H01L 33/382 257/98 |
| 2012/0018734 A1* | 1/2012 | Chae | H01L 33/382 257/76 |
| 2012/0049229 A1* | 3/2012 | Lim | H01L 33/382 257/98 |
| 2012/0235114 A1* | 9/2012 | Tsang | H01L 33/46 257/13 |
| 2012/0235168 A1* | 9/2012 | Katsuno | H01L 33/22 257/88 |
| 2013/0052759 A1 | 2/2013 | Odnoblyudov et al. | |
| 2013/0082290 A1 | 4/2013 | Yan et al. | |
| 2013/0087814 A1* | 4/2013 | Moon | H01L 33/64 257/88 |
| 2014/0021507 A1 | 1/2014 | Engl et al. | |
| 2014/0048824 A1* | 2/2014 | Hsieh | H01L 33/50 257/88 |
| 2014/0061702 A1 | 3/2014 | Yamamoto et al. | |
| 2014/0138730 A1 | 5/2014 | Reufer et al. | |
| 2016/0005930 A1 | 1/2016 | Engl et al. | |

FOREIGN PATENT DOCUMENTS

| | | | |
|---|---|---|---|
| DE | 102007019775 A1 | 10/2008 | |
| DE | 102009033686 A1 | 1/2011 | |
| DE | 102011011140 A1 | 8/2012 | |
| DE | 102011013821 A1 | 9/2012 | |
| DE | 102011016302 A1 | 10/2012 | |
| JP | H11340514 A | 12/1999 | |
| JP | 2005302747 A | 10/2005 | |
| TW | 201244176 A | 11/2012 | |
| TW | 201246626 A | 11/2012 | |
| WO | WO 2012/031852 | * 3/2012 | H01L 33/00 |
| WO | 2012123410 A1 | 9/2012 | |
| WO | 2012171817 A2 | 12/2012 | |

* cited by examiner

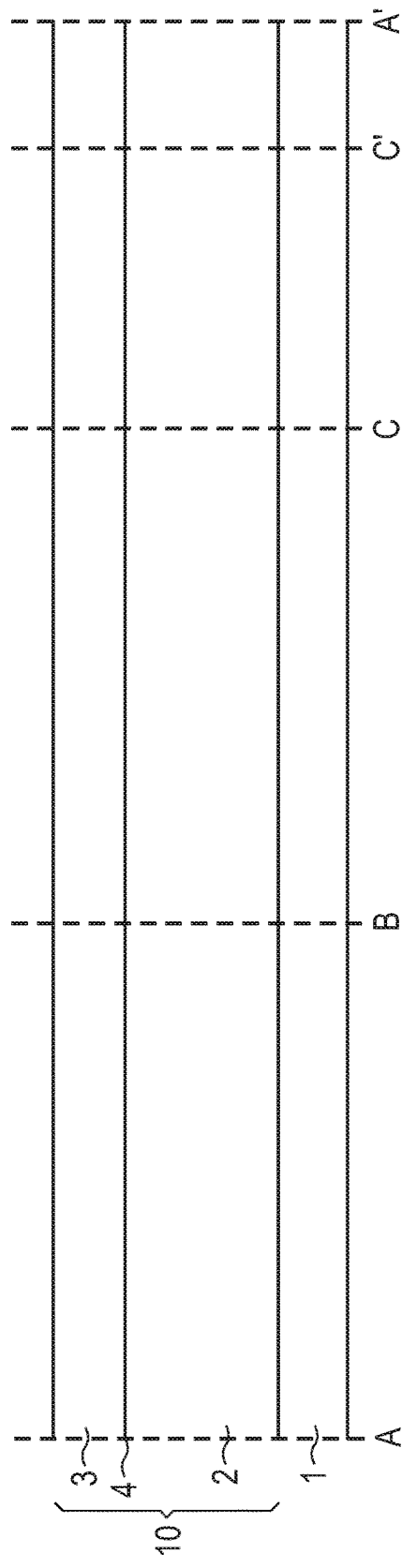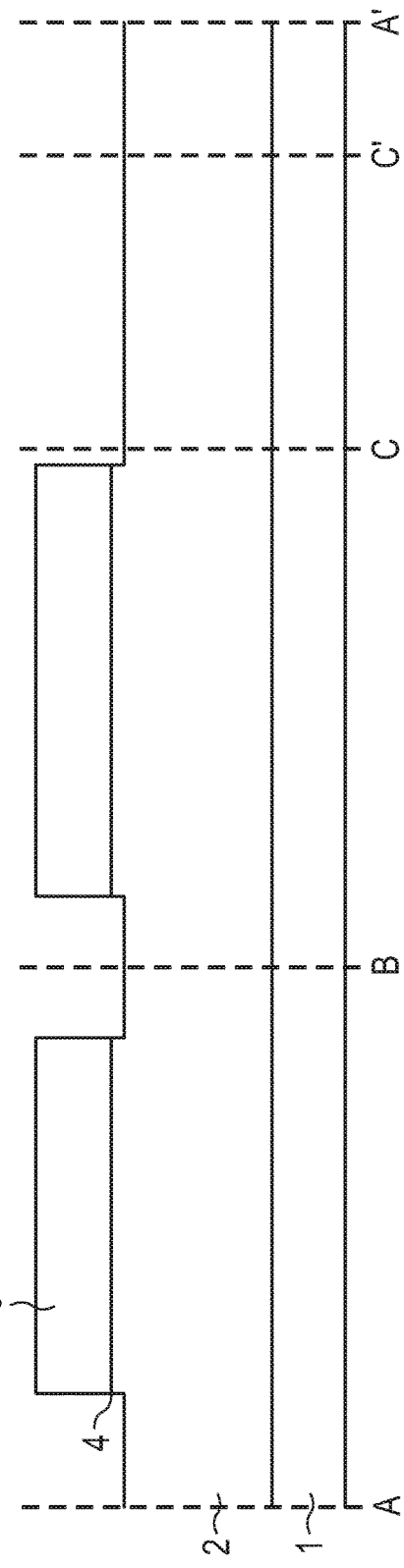

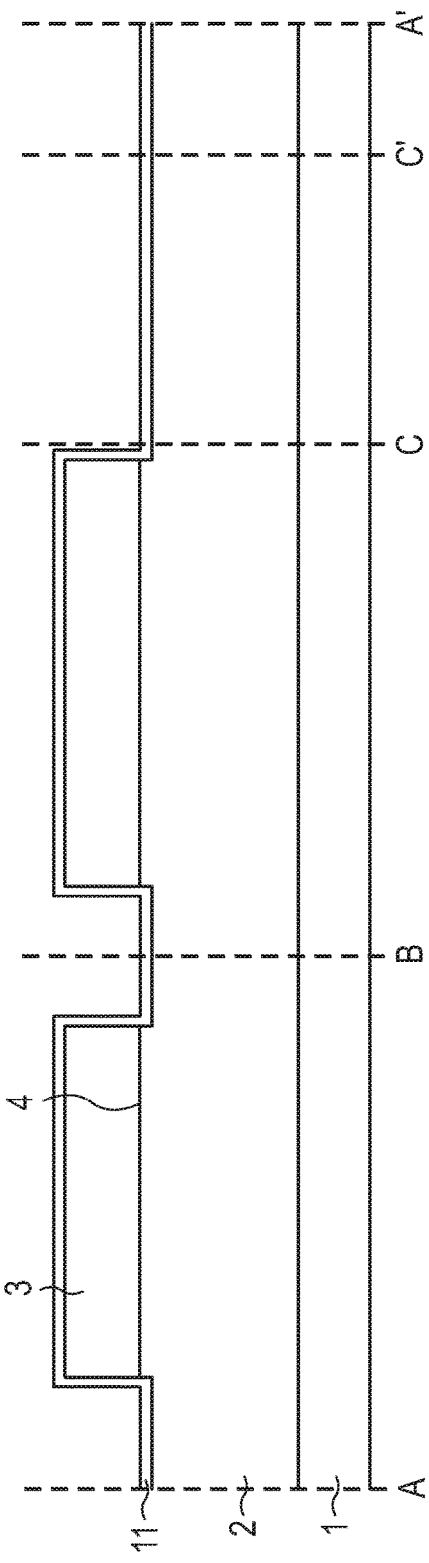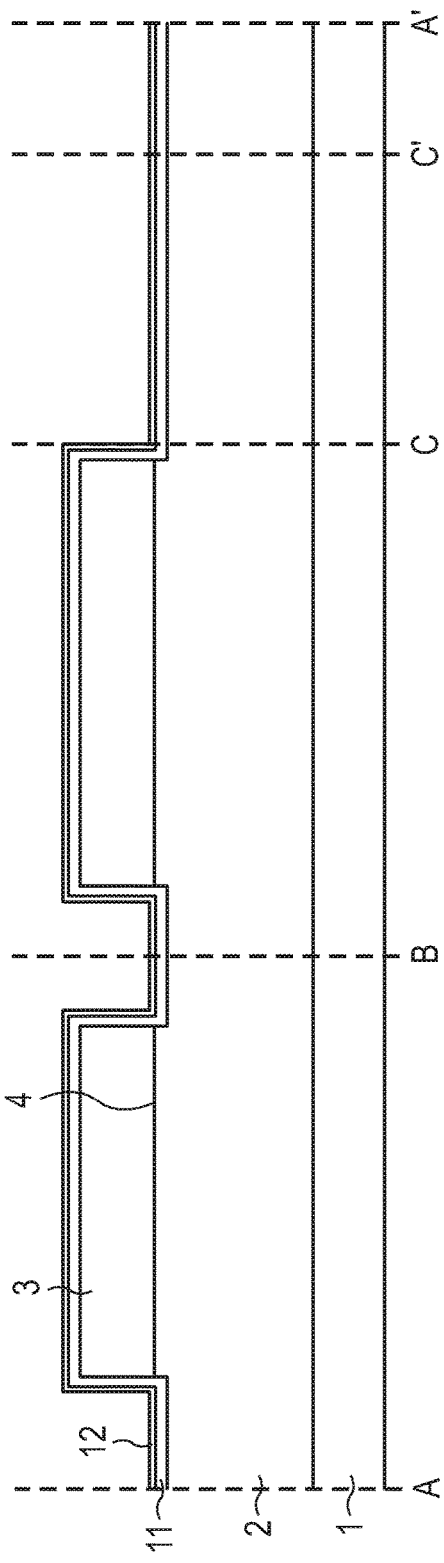

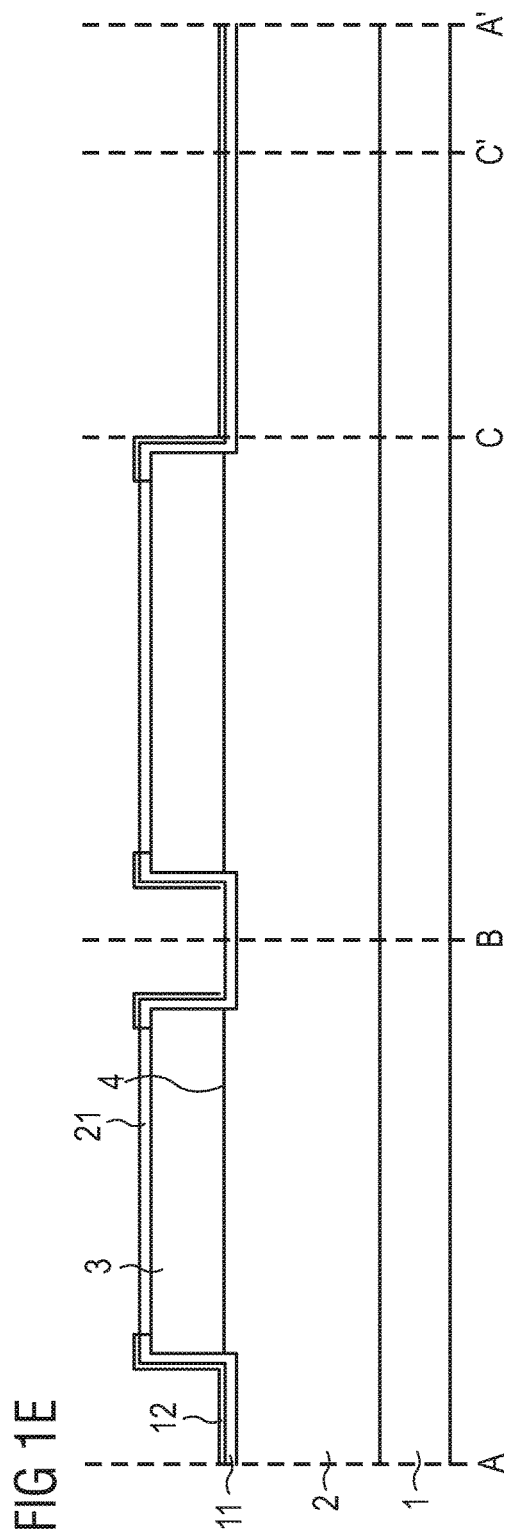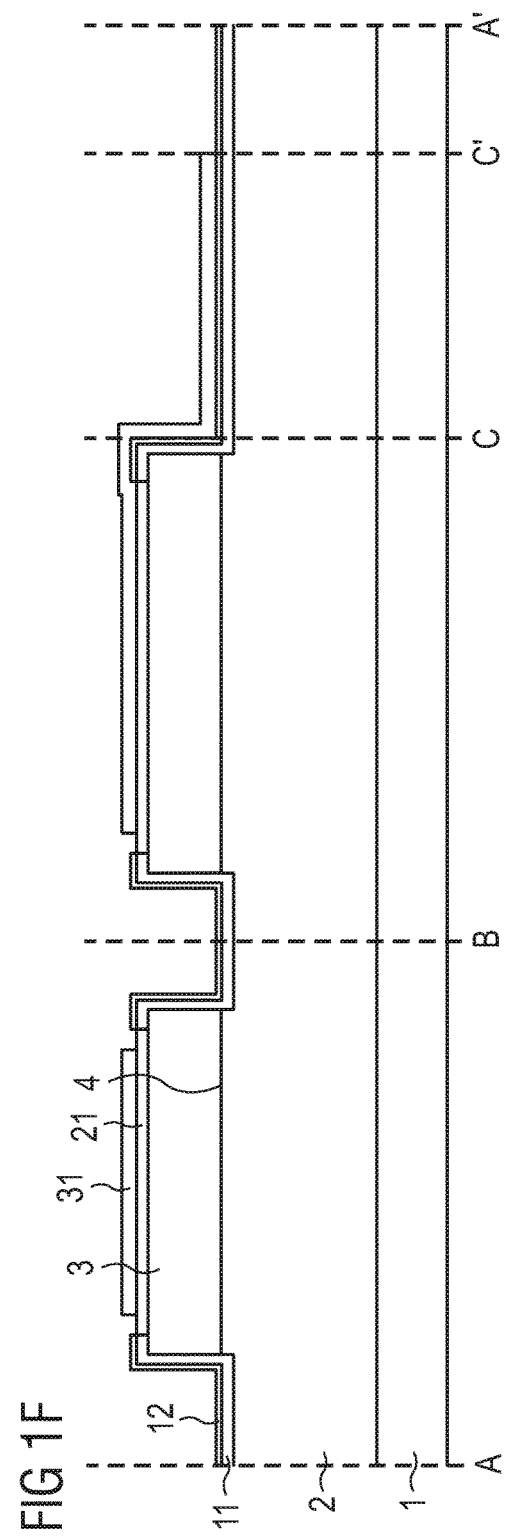

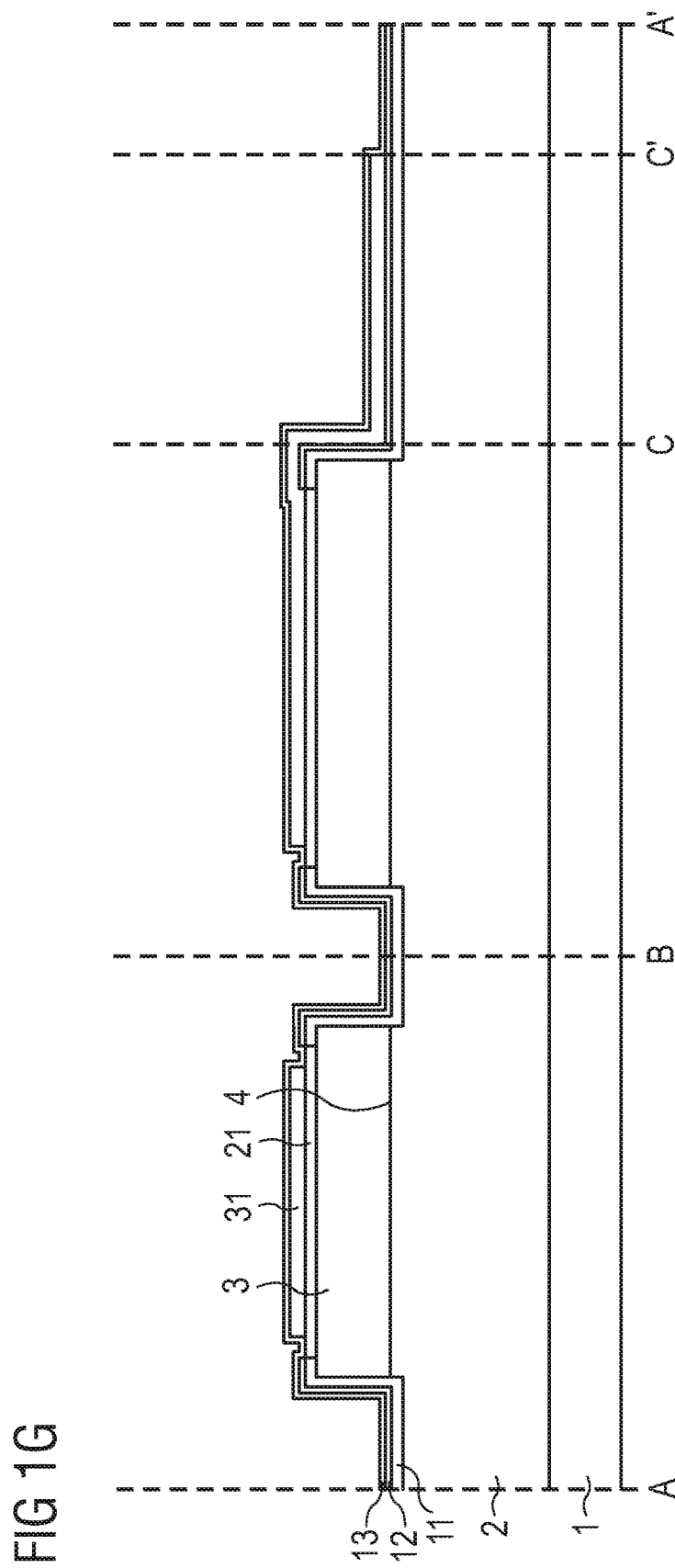

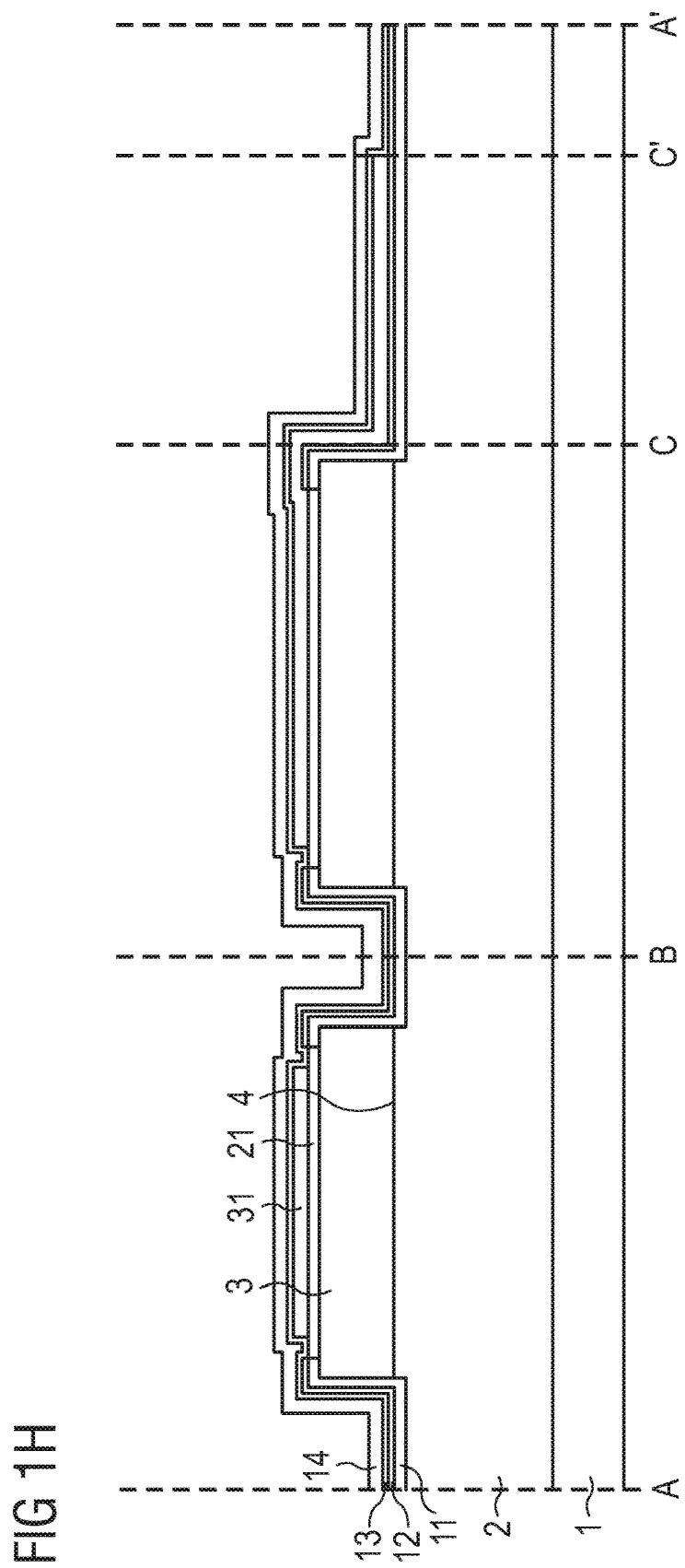

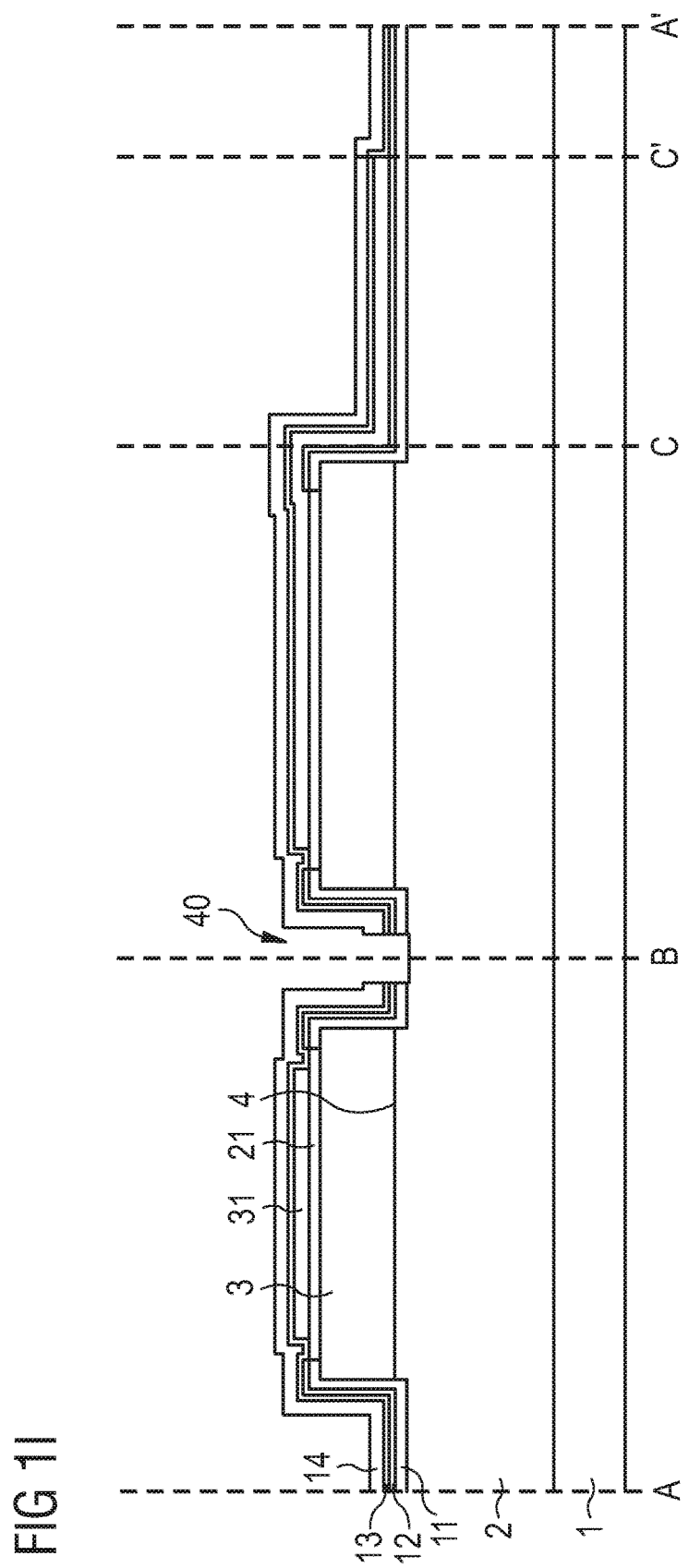

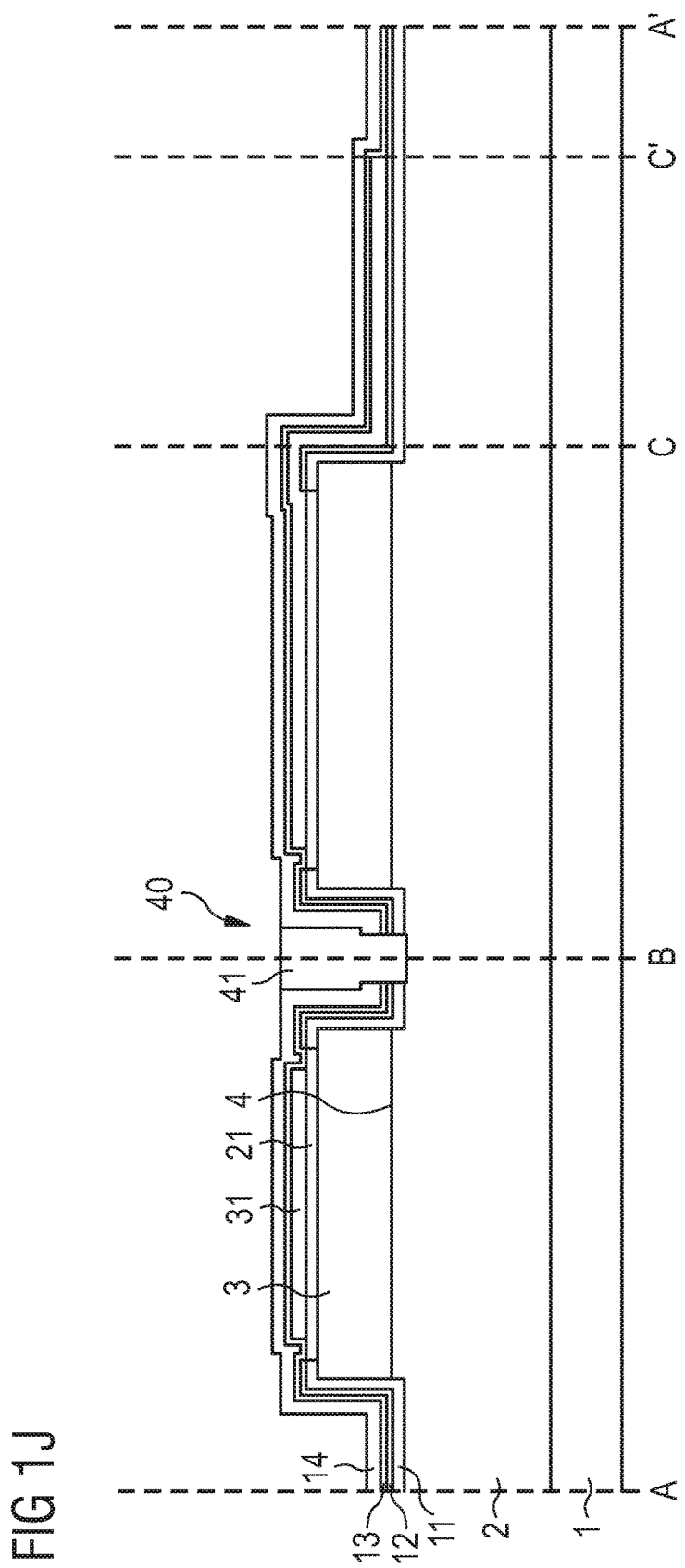

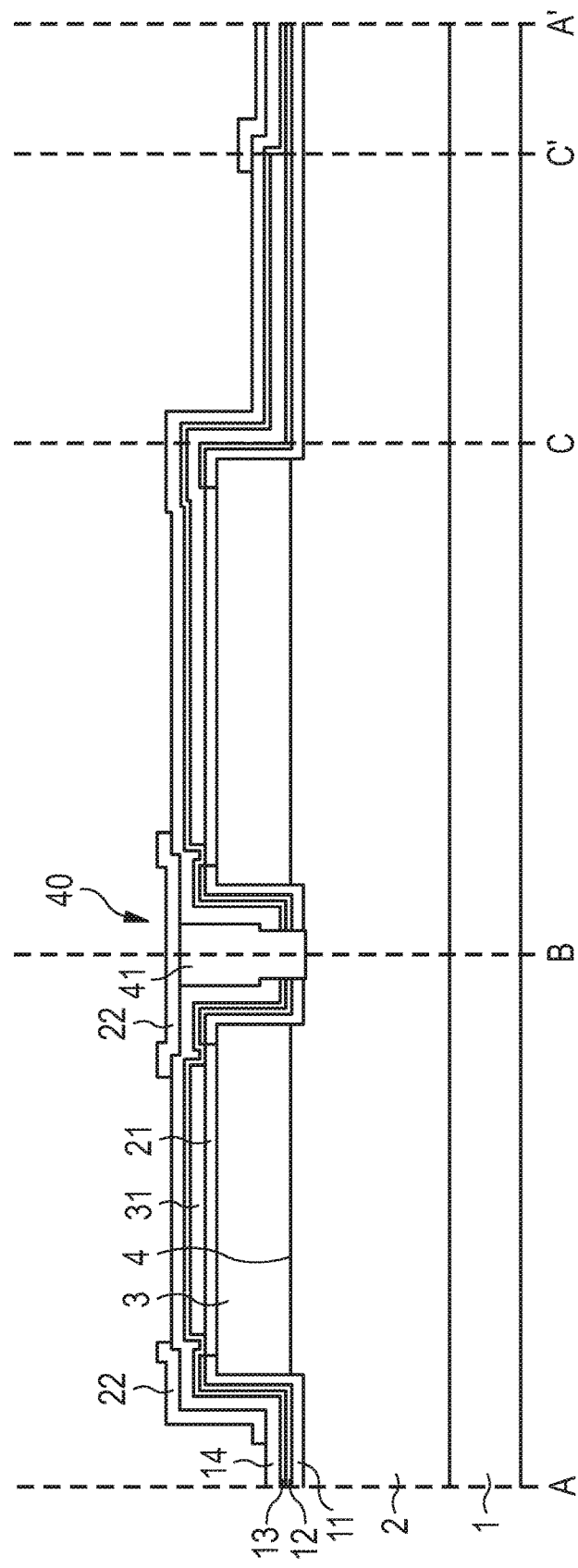

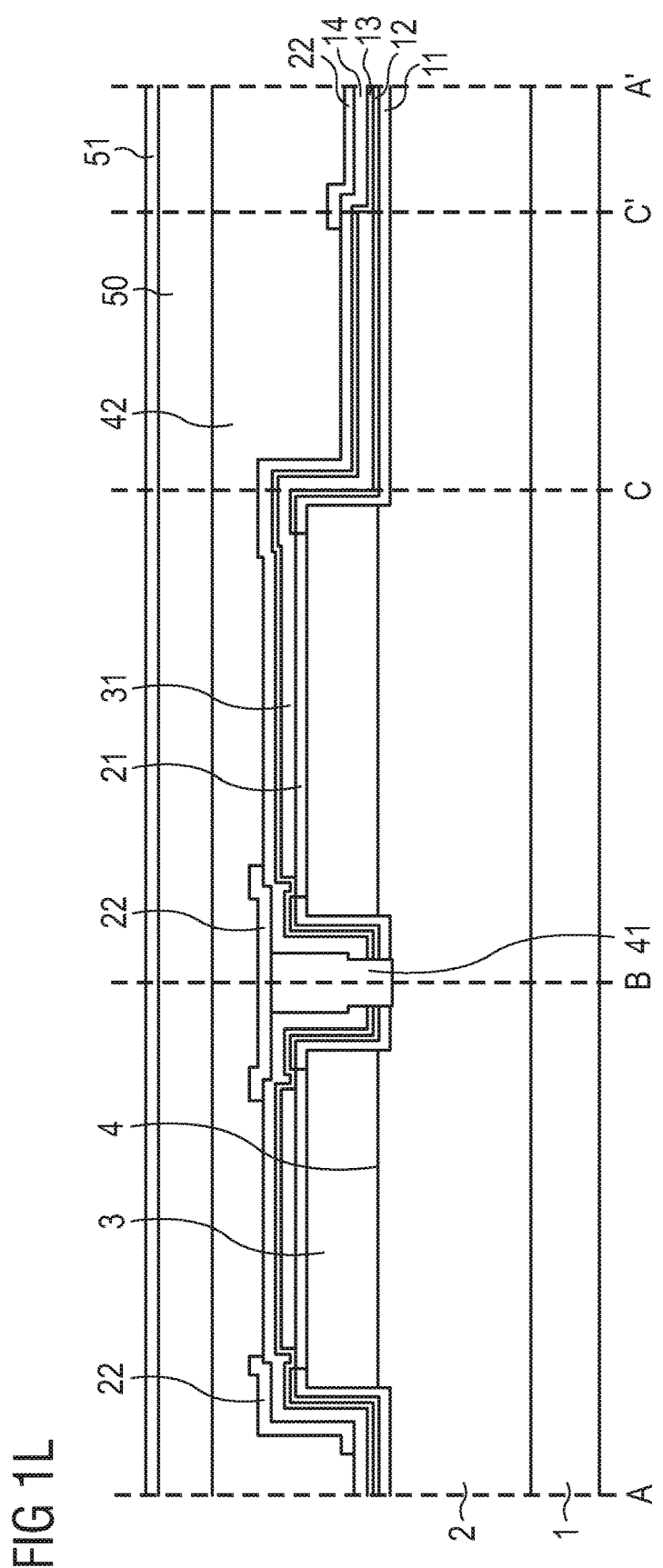

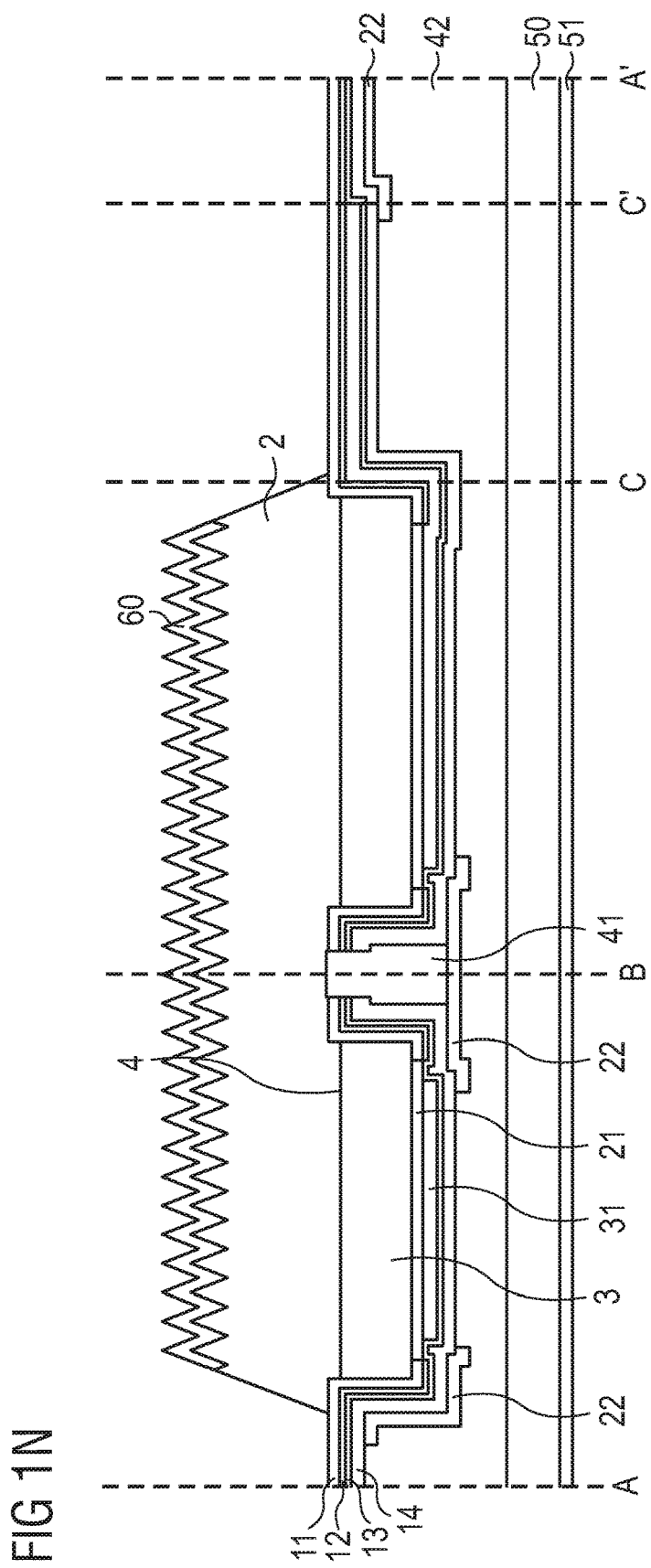

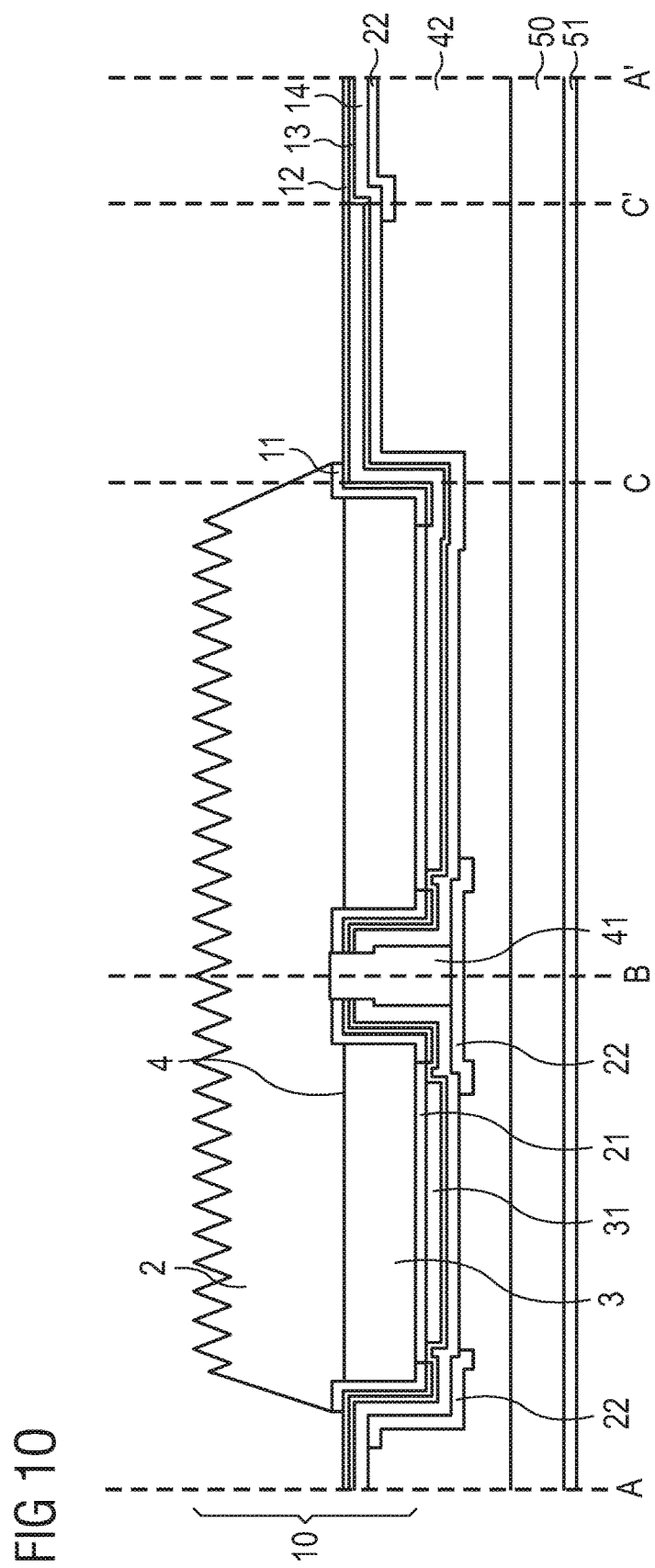

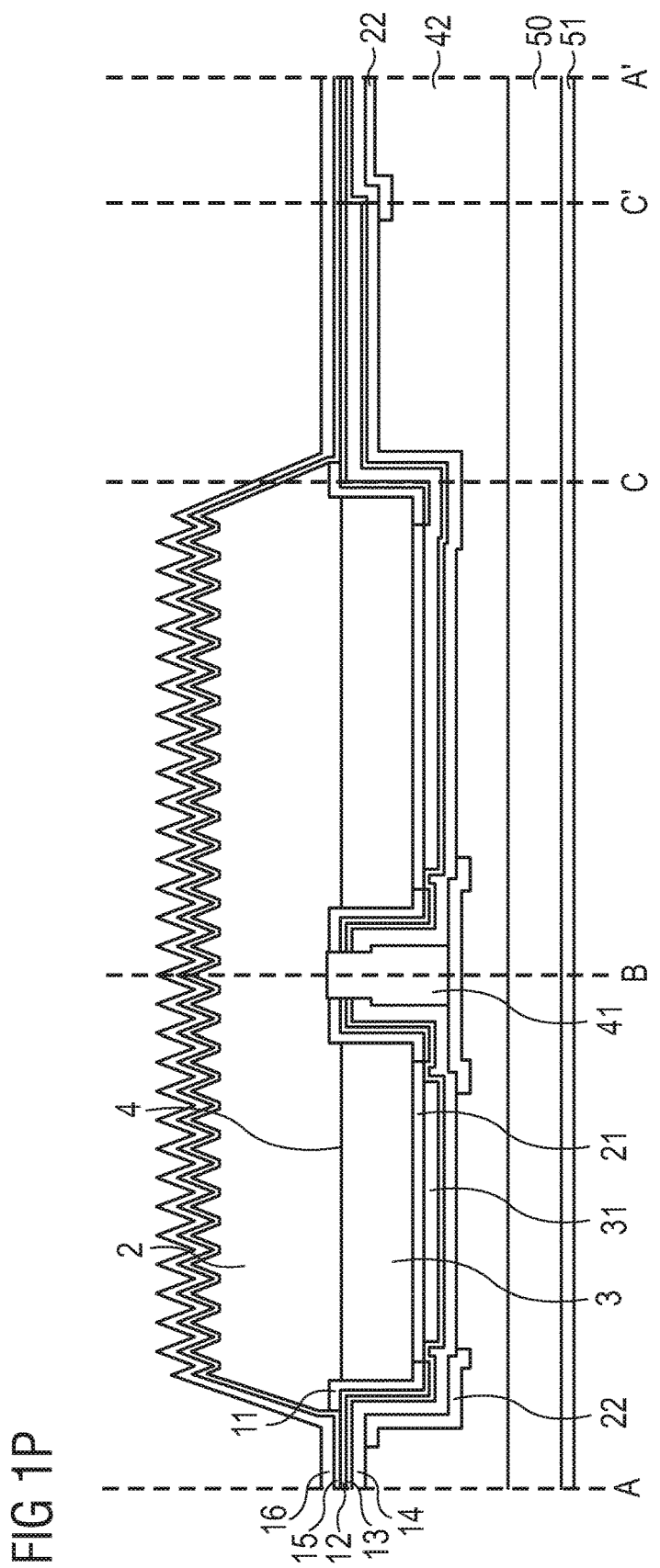

OPTOELECTRONIC SEMICONDUCTOR CHIP

This patent application is a national phase filing under section 371 of PCT/EP2014/063423, filed Jun. 25, 2014, which claims the priority of German patent application 10 2013 107 531.2, filed Jul. 16, 2013, each of which is incorporated herein by reference in its entirety.

TECHNICAL FIELD

An optoelectronic semiconductor chip is provided.

BACKGROUND

International Patent Publication WO 2012/171817 describes an optoelectronic semiconductor chip.

SUMMARY

Embodiments of the present invention provide an optoelectronic semiconductor chip which has improved efficiency and improved low current performance.

According to at least one embodiment of the optoelectronic semiconductor chip, the optoelectronic semiconductor chip comprises a semiconductor body. The semiconductor body is formed, for example, with a III-V semiconductor material, for example, with a nitride compound semiconductor material. The semiconductor body comprises an n-conductive region, a p-conductive region and an active region therebetween, which is provided for generating electromagnetic radiation. The n-conductive region and p-conductive region are produced, for example, by corresponding doping of the semiconductor material of the semiconductor body.

The electromagnetic radiation generated in the active region of the semiconductor body, for example, comprises UV radiation, infrared radiation and/or visible light. The electromagnetic radiation is generated, for example, by energizing the active region. The electromagnetic radiation leaves the semiconductor body at least in part through an outer face of the semiconductor body.

According to at least one embodiment of the optoelectronic semiconductor chip, the optoelectronic semiconductor chip comprises a first mirror layer, which is provided to reflect the electromagnetic radiation generated in the active region. The first mirror layer is arranged, for example, on a first major face of the semiconductor body. A major part of the electromagnetic radiation generated in the active region during operation then leaves the optoelectronic semiconductor chip through a second major face opposite the first major face. In this respect, electromagnetic radiation generated in the active region of the semiconductor body impinges in part on the first mirror layer and is reflected thereby towards the outer face of the semiconductor body, in particular towards the second major face, where it then exits in part.

The mirror layer is in particular metallic. For example, the mirror layer contains or consists of one of the following metals: silver, aluminum. These metals display good to very good reflectivity for visible light, but may have the disadvantage of a tendency towards diffusion or electromigration in particular when, as is the case during operation of the optoelectronic semiconductor chip, an electromagnetic field is present. In addition, in particular in a humid surrounding environment these metals may oxidize, which reduces reflectivity and thus the efficiency of the semiconductor body to an ever greater extent as operating time increases.

According to at least one embodiment of the optoelectronic semiconductor chip, the optoelectronic semiconductor chip comprises at least three encapsulation layers. The optoelectronic semiconductor chip may comprise a first encapsulation layer, a second encapsulation layer and a third encapsulation layer. The at least three encapsulation layers are each of electrically insulating construction and to this end are formed with an electrically insulating material. The encapsulation layers may each comprise one or more layers. Different encapsulation layers may differ from one another through the use of different methods for the production thereof and/or different material compositions and/or a different arrangement in the optoelectronic semiconductor chip.

The encapsulation layers are provided in particular to stop diffusion of material from the first mirror layer into other regions of the optoelectronic semiconductor chip and/or to impede or prevent penetration of atmospheric gases and/or moisture to the first mirror layer and/or to electrically insulate regions of the optoelectronic semiconductor chip from other regions of the optoelectronic semiconductor chip.

According to at least one embodiment of the optoelectronic semiconductor chip, the first mirror layer is arranged on an underside of the p-conductive region. The underside of the p-conductive region is, for example, the side of the semiconductor body remote from the n-conductive region. The mirror layer may be in direct contact with the p-conductive region. The first mirror layer then serves in particular also to inject electrical current into the p-conductive region during operation of the optoelectronic semiconductor chip.

According to at least one embodiment of the optoelectronic semiconductor chip, the active region is arranged on a side of the p-conductive region remote from the first mirror layer and the n-conductive region is arranged on a side of the active region remote from the p-conductive region. In other words, the active region is arranged between p-conductive region and n-conductive region, wherein the first mirror layer is arranged on the bottom of the p-conductive region remote from the n-conductive region.

According to at least one embodiment of the optoelectronic semiconductor chip, the first, second and third encapsulation layers cover the semiconductor body in places on the outer face thereof. The encapsulation layers extend in places along the outer face of the semiconductor body and at least one of the encapsulation layers may be in direct contact with the semiconductor body. For example, the first encapsulation layer is in places in direct contact with the semiconductor body.

According to at least one embodiment of the optoelectronic semiconductor chip, the third encapsulation layer completely covers the first mirror layer on the side thereof remote from the p-conductive region and is in places in direct contact with the first mirror layer. This means that it is possible for at least one further layer, for example, a metallic layer, to be arranged in places between the third encapsulation layer and the first mirror layer. However, there is at least one region in which the third encapsulation layer is in direct contact with the first mirror layer. There the third encapsulation layer may, for example, be applied directly onto the mirror layer. The third encapsulation layer covers the mirror layer on the side thereof remote from the p-conductive region in a gap-free manner, wherein the mirror layer directly adjoins the p-conductive region, for example, at the bottom thereof facing the p-conductive region and the other, free outer face of the first mirror layer is surrounded by the third encapsulation layer.

According to at least one embodiment of the optoelectronic semiconductor chip, the second encapsulation layer and the third encapsulation layer are in direct contact with one another in places in a region to the side of the first mirror layer. A region to the side of the first mirror layer is, for example, a region which is arranged spaced from the first mirror layer in a lateral direction. The lateral directions are those directions which extend parallel to a main plane of extension of the first mirror layer. To the side of the mirror layer, in particular spaced from the region in which the third encapsulation layer and the first mirror layer are in direct contact with one another, the second encapsulation layer and the third encapsulation layer are in direct contact with one another.

According to at least one embodiment of the optoelectronic semiconductor chip, the third encapsulation layer and the second encapsulation layer are ALD layers. This means that at least these two encapsulation layers, and optionally also further encapsulation layers, such as, for example, the first encapsulation layer, are layers which have been produced using an ALD (Atomic Layer Deposition) method. An ALD method enables very thin layers to be produced, which have a polycrystalline or amorphous structure. Since a layer produced using ALD grows in proportion to the number of reaction cycles with which the layer is produced, exact control of the layer thickness of such an ALD layer is possible. An ALD method enables particularly uniform layers to be produced, i.e., layers of particularly uniform thickness and/or particularly uniform material composition. In addition, through monolayer growth ALD methods enable the production of very dense layers with a low level of crystal defects.

At least the second and third encapsulation layers are thus produced using an ALD method such as, for example, flash ALD, photo-induced ALD or another ALD method. A high temperature ALD method may in particular also be used, in which the encapsulation layer is deposited at temperatures of 100° C. or higher.

An encapsulation layer produced using an ALD method can be clearly distinguished by electron microscopic examination and other analytical methods used in semiconductor technology from layers which are produced by alternative methods such as, for example, conventional CVD (Chemical Vapor Deposition). The feature according to which an encapsulation layer is an ALD layer is therefore an objective feature, which is detectable on the finished optoelectronic semiconductor chip.

The encapsulation layer which is an ALD layer is formed with an electrically insulating material and has a thickness, for example, of between 0.05 nm and at most 500 nm, in particular between at least 30 nm and at most 50 nm, for example, a thickness of 40 nm. The encapsulation layer may comprise a multiplicity of sublayers arranged on top of one another. The encapsulation layer contains or consists, for example, of one of the following materials: $Ta_2O_5$, $Al_2O_3$, AlN, $SiO_2$. It is in particular also possible for the encapsulation layer which is an ALD layer to contain a combination of these materials. The ALD layers are in this case preferably free of silicon dioxide and/or silicon nitride.

According to at least one embodiment of the optoelectronic semiconductor chip, the optoelectronic semiconductor chip comprises a semiconductor body, which comprises an n-conductive region, an active region provided to generate electromagnetic radiation and a p-conductive region. The optoelectronic semiconductor chip further comprises a first mirror layer, which is provided to reflect the electromagnetic radiation. The optoelectronic semiconductor chip additionally comprises a first, a second and a third encapsulation layer, wherein the encapsulation layers are each formed with an electrically insulating material. The first mirror layer is arranged on a bottom of the p-conductive region, the active region is arranged on a side of the p-conductive region remote from the first mirror layer and the n-conductive region is arranged on a side of the active region remote from the p-conductive region. According to this embodiment of the optoelectronic semiconductor chip, the first, second and third encapsulation layers cover the semiconductor body at the outer face thereof and the third encapsulation layer completely covers the first mirror layer on the side thereof remote from the p-conductive region, wherein it is in places in direct contact with the first mirror layer. The second encapsulation layer and the third encapsulation layer are in direct contact with one another in places in at least one region to the side of the first mirror layer and the second and third encapsulation layers are ALD layers.

An optoelectronic semiconductor chip described here is based inter alia on the following considerations: an optoelectronic semiconductor chip, in particular a light-emitting diode chip, must be reliably protected against exposure to moisture from the surrounding environment to ensure durability. In particular, mirror layers in the optoelectronic semiconductor chip, which have been formed with a material with a tendency to migration in the electrical field and to oxidation, such as silver, may, for example, be protected from penetration of moisture or penetration of other atmospheric gases by metallic encapsulation. However, such metallic encapsulations often absorb radiation and may therefore reduce the efficiency of the optoelectronic semiconductor chip.

In the present case, the first mirror layer is in particular covered completely by the third encapsulation layer, which is an ALD layer. This constitutes particularly effective protection of the first mirror layer from penetration of moisture and atmospheric gases. As a result of the particularly good protection ensured by the ALD layer, the first mirror layer may be brought up particularly close to an outer side face of the semiconductor body, without the likelihood of damage to the first mirror layer during production of the optoelectronic semiconductor chip. Due to the resultant possible enlargement of the reflective surface area of the first mirror layer, the efficiency of the optoelectronic semiconductor chip may be increased. A further increase in efficiency is brought about in that the encapsulation layers which are ALD layers are particularly thin and may be formed from a radiation-transmissive material. Undesired absorption of electromagnetic radiation in the optoelectronic semiconductor chip is therefore reduced.

According to at least one embodiment of the optoelectronic semiconductor chip, the semiconductor chip comprises a second mirror layer, which is arranged on the bottom, remote from the semiconductor body, of the third encapsulation layer, wherein the second mirror layer projects in a lateral direction over the outer face of the semiconductor body.

The second mirror layer may be formed with the same material as the first mirror layer. The second mirror layer serves to render reflective regions of the optoelectronic semiconductor chip that would otherwise absorb light and thus further to increase the efficiency of the optoelectronic semiconductor chip. The second mirror layer may be electrically conductive. In this way, the second mirror layer may, for example, be electrically conductively connected with the n-conductive region of the semiconductor body and serves, in addition to the optical characteristics thereof, also to inject current into the n-conductive region of the semiconductor body.

At least some of the encapsulation layers may be located at least indirectly between the first mirror layer and the second mirror layer. In this way, the third and optionally further encapsulation layers may, for example, form electrical insulation between the first mirror layer and the second mirror layer.

According to at least one embodiment of the optoelectronic semiconductor chip, the second mirror layer projects in a lateral direction over the outer face of the semiconductor body. At least some of the encapsulation layers may extend on the side of the second mirror layer facing the semiconductor body. The second mirror layer is provided to reflect electromagnetic radiation generated in the semiconductor body during operation.

The second mirror layer projects over the semiconductor body in a lateral direction, which extends parallel to the main plane of extension of the semiconductor body. The second mirror layer thus projects laterally over the semiconductor body. In this way, the second mirror layer may also reflect electromagnetic radiation which exits from the side faces of the semiconductor body and then travels towards the second mirror layer.

According to at least one embodiment of the optoelectronic semiconductor chip, the first encapsulation layer on the outer face of the semiconductor body extends from the active region along the p-conductive region to a side face of the first mirror layer. In this case, the first encapsulation layer is in places in direct contact with the first mirror layer. In particular, the first encapsulation layer may be in direct contact with a side face of the first mirror layer. The first encapsulation layer is not, for example, an ALD layer. The first encapsulation layer may be produced, for example, using a CVD method and, for example, comprise sublayers, which are formed with $SiO_2$ and/or SiN. In this case, the SiN sublayers are preferably thinner than the $SiO_2$ sublayers. The sublayers may, for example, be arranged one above the other in a vertical direction, parallel to the direction of growth of the layer. The first encapsulation layer may, for example, comprise a first sublayer formed with $SiO_2$, which has a thickness of between 130 nm and 170 nm, in particular of 150 nm. A further sublayer formed with SiN and having a thickness of between 10 nm and 14 nm, in particular of 12 nm may be applied directly to this sublayer. The first encapsulation layer may comprise one or more of these sequences of sublayers formed with $SiO_2$ and SiN.

The first encapsulation layer may protect regions covered by the first encapsulation layer from such materials as are used in the formation of ALD layers, for example, in the formation of the second encapsulation layer. For example, the semiconductor body covered by the first encapsulation layer may be protected by the first encapsulation layer from a precursor such as oxygen or ozone, which is used in the production of subsequent encapsulation layers which are ALD layers.

According to at least one embodiment of the optoelectronic semiconductor chip, the optoelectronic semiconductor chip comprises a fourth encapsulation layer, which completely covers the third encapsulation layer on the side thereof remote from the semiconductor body and is in direct contact at least in places with the third encapsulation layer. The fourth encapsulation layer may, for example, likewise be a layer which is not an ALD layer. This layer is then not deposited using an ALD method but rather, for example, using a CVD method. The fourth encapsulation layer may, for example, be formed identically to the first encapsulation layer and likewise protect the regions covered against materials used in the production of ALD layers.

According to at least one embodiment of the optoelectronic semiconductor chip, the optoelectronic semiconductor chip comprises a fifth encapsulation layer, which is an ALD layer, wherein the fifth encapsulation layer completely covers the outer face of the semiconductor body at least at the n-conductive region and is in places to the side of the semiconductor body in direct contact with the second encapsulation layer. The semiconductor body may be covered by the fifth encapsulation layer at exposed regions which would be uncovered without the fifth encapsulation layer and may there also be in direct contact with the fifth encapsulation layer. The fifth encapsulation layer may, for example, be of identical construction to the second encapsulation layer. It may thus have the same thickness and the same material composition as the second encapsulation layer.

The fifth encapsulation layer is in direct contact with the second encapsulation layer to the side of the semiconductor body, i.e., for example, spaced in the lateral direction from the semiconductor body. The fifth encapsulation layer and the second encapsulation layer thus comprise at least one common contact point (hereinafter also triple point), at which the ALD layers directly adjoin one another. In this way, the semiconductor body is surrounded almost completely by encapsulation layers produced using an ALD method. This allows particularly good protection of the semiconductor body from moisture and atmospheric gases.

According to at least one embodiment of the optoelectronic semiconductor chip, the second encapsulation layer comprises traces of an etching process in the region in contact with the fifth encapsulation layer. In particular, the surface of the second encapsulation layer facing the fifth encapsulation layer and which may be in direct contact with the fifth encapsulation layer comprises traces of an etching process.

In other words, the second encapsulation layer is exposed to an etching method during production of the optoelectronic semiconductor chip. The etching method produces on the second encapsulation layer, which is an ALD layer, characteristic traces which are detectable using testing methods commonly used in semiconductor electronics. These traces may, for example, be roughening of the second encapsulation layer on the side thereof facing the fifth encapsulation layer. In this way, the fifth encapsulation layer adheres particularly well to the second encapsulation layer in the regions in which the second encapsulation layer comprises traces of the etching process.

According to at least one embodiment of the optoelectronic semiconductor chip, the second encapsulation layer is thinner in the region in contact with the fifth encapsulation layer than in a region in which there is no contact between the second encapsulation layer and the fifth encapsulation layer. The thickness of the second encapsulation layer may, for example, be reduced by an etching process. For example, the second encapsulation layer in the region in contact with the fifth encapsulation layer is between 4 nm and 8 nm, in particular between 5 nm and 7 nm thinner than in a region in which there is no contact between the second encapsulation layer and the fifth encapsulation layer. The second encapsulation layer does not however comprise any opening, but rather the thickness thereof is merely reduced in the region in contact with the fifth encapsulation layer. The second encapsulation layer is, for example, etched in a method step intended to remove the first encapsulation layer, which prior to the etching step is in direct contact with the second encapsulation layer. The first encapsulation layer, for example, comprises a layer containing silicon dioxide. Etching selectivity between silicon dioxide and the second encapsulation layer, which is an ALD layer, is in the range of 1:80. In this way, there is no risk of the second encapsulation layer being etched through.

The etching process used is, for example, dry chemical. Because the etching process does not, as is otherwise often conventional, end at a metallic layer, which may, for example, be formed with platinum, no metals are applied by redeposition onto the semiconductor body and in particular no metals are applied in the region of the pn junction, i.e., at the active region. A cleaning step, which otherwise might be necessary, can thus be omitted. Since potential aging problems resulting from impairment of low current performance caused by redeposition during etching are no longer at all possible, the optoelectronic semiconductor chip is distinguished by simplified production and improved efficiency. It has here been found that the low current performance of the optoelectronic semiconductor chip is greatly improved as a result of the etching on the second encapsulation layer, such that even at very low current intensities of 1 μA electromagnetic radiation may be generated highly efficiently.

According to at least one embodiment of the optoelectronic semiconductor chip, the optoelectronic semiconductor chip comprises a through-via, which extends through the p-conductive region and the active region into the n-conductive region of the semiconductor body. Apart from the at least one through-via, the semiconductor body is completely surrounded by the third encapsulation layer and the fifth encapsulation layer. In other words, the semiconductor body is surrounded completely by layers which are ALD layers apart from the region of the through-via.

The at least one through-via may pass through at least some of the encapsulation layers, the first mirror layer, the p-conductive region of the semiconductor body and the active region. It is in this respect in particular possible for the optoelectronic semiconductor chip to comprise a multiplicity of similar through-vias.

The through-via, for example, comprises an opening in the semiconductor body which is filled with the n-contact material. The n-contact material is, for example, a metal. The n-contact material is in direct contact with the n-conductive region and provides an electrically conductive connection, for example, to a connection point of the optoelectronic semiconductor chip which is contactable from outside the semiconductor chip.

The first, second, third and fourth encapsulation layers may, for example, directly adjoin the n-contact material. For example, at least some of the encapsulation layers cover the semiconductor body within the through-via and serve in this way to insulate the n-contact material electrically from the first mirror layer, the p-conductive region of the semiconductor body and the active region.

According to at least one embodiment of the optoelectronic semiconductor chip, the semiconductor chip comprises a second mirror layer, which is arranged on the bottom of the n-contact material remote from the n-conductive region, wherein the third encapsulation layer and the fourth encapsulation layer are arranged in places between the first mirror layer and the second mirror layer. The second mirror layer may be formed with the same material as the first mirror layer. The second mirror layer serves to render reflective regions of the optoelectronic semiconductor chip that would otherwise absorb light and thus further to increase the efficiency of the optoelectronic semiconductor chip. The second mirror layer is arranged, for example, beneath the n-contact material and projects in the lateral direction beyond the through-via. Electromagnetic radiation which occurs in the region of the through-via may be reflected by the second mirror layer. The second mirror layer may be connected electrically conductively to the n-contact material and in particular be in direct contact with the n-contact material. In this way, the second mirror layer is electrically conductively connected with the n-conductive region of the semiconductor body and serves, in addition to the optical characteristics thereof, also to inject current into the n-conductive region of the semiconductor body.

At least some of the encapsulation layers may be located at least indirectly between the first mirror layer and the second mirror layer. In this way, the third and fourth encapsulation layers may, for example, form electrical insulation between the first mirror layer and the second mirror layer. If the second mirror layer is electrically conductively connected for example to the n-conductive region of the semiconductor body, the first mirror layer may then be electrically connected to the p-conductive region of the semiconductor body. In this case, the first mirror layer serves, in addition to the optical characteristics thereof, also in electrical connection of the p-conductive region of the semiconductor body.

According to at least one embodiment of the optoelectronic semiconductor chip, the second mirror layer projects in a lateral direction over the outer face of the semiconductor body. At least some of the encapsulation layers may extend on the side of the second mirror layer facing the semiconductor body. The second mirror layer is provided to reflect electromagnetic radiation generated in the semiconductor body during operation.

The second mirror layer projects over the semiconductor body in a lateral direction, which extends parallel to the main plane of extension of the semiconductor body. The second mirror layer thus projects laterally over the semiconductor body. In this way, the second mirror layer may also reflect electromagnetic radiation which exits from the side faces of the semiconductor body and then travels towards the second mirror layer. The region of the second mirror layer which projects in a lateral direction over the outer face of the semiconductor body does not have to be connected to the region of the second mirror layer which is arranged on the bottom of the n-contact material remote from the n-conductive region. The two regions of the second mirror layer may however be applied, for example, in the same production step, for example, using masking technology.

According to at least one embodiment of the optoelectronic semiconductor chip, the distance between a side face of the first mirror layer and a side face of the n-conductive region in a lateral direction is at most 2.5 μm, in particular at most 1.5 μm. The side faces in each case extend transversely or perpendicularly to the lateral directions and constitute outer faces of the first mirror layer or of the n-conductive region.

Such a small distance between the first mirror layer and the outer face of the semiconductor body is made possible in that the first mirror layer is completely covered by means of the third encapsulation layer, which is an ALD layer.

In combination with the further encapsulation layers, such as, for example, the second encapsulation layer, which in places directly adjoins the third encapsulation layer and likewise is an ALD layer, the second mirror layer is encapsulated particularly well thereby against external influences and may be brought up particularly close to the outer face of the semiconductor body, i.e., the side face of the n-conductive region. This makes possible an increase in efficiency, for example, a light gain, of around 1.5%. Edge absorption, for example, by an additional encapsulating p-conductive material may be prevented in this way. At the same time, potential aging problems are reduced, in particular with regard to the chip's low current performance.

According to at least one embodiment of the optoelectronic semiconductor chip, the p-conductive region and the first mirror layer are covered at their side faces in places by a metallic encapsulation layer, wherein at least some of the encapsulation layers extend at least in part between the metallic encapsulation layer and the side faces. In other words, the p-conductive region of the semiconductor body projects in places into the metallic encapsulation layer, which acts, for example, as a planarization layer with regard to a carrier of the optoelectronic semiconductor chip remote from the semiconductor body. The metallic encapsulation layer may thus, for example, cover over a topography on the side of the semiconductor body facing the carrier and planarize it. The metallic encapsulation layer is, for example, an encapsulation layer which stops the diffusion of material out of the mirror layers. The metallic encapsulation layer may to this end be formed of or with metals such as platinum, gold, tungsten and titanium. In other words, the metallic encapsulation layer then comprises at least one of these metals or is formed by a combination of these metals.

BRIEF DESCRIPTION OF THE DRAWINGS

The optoelectronic semiconductor chip described here and a method for the production thereof are explained in greater detail below with reference to exemplary embodiments and the associated figures.

Figure 1M:
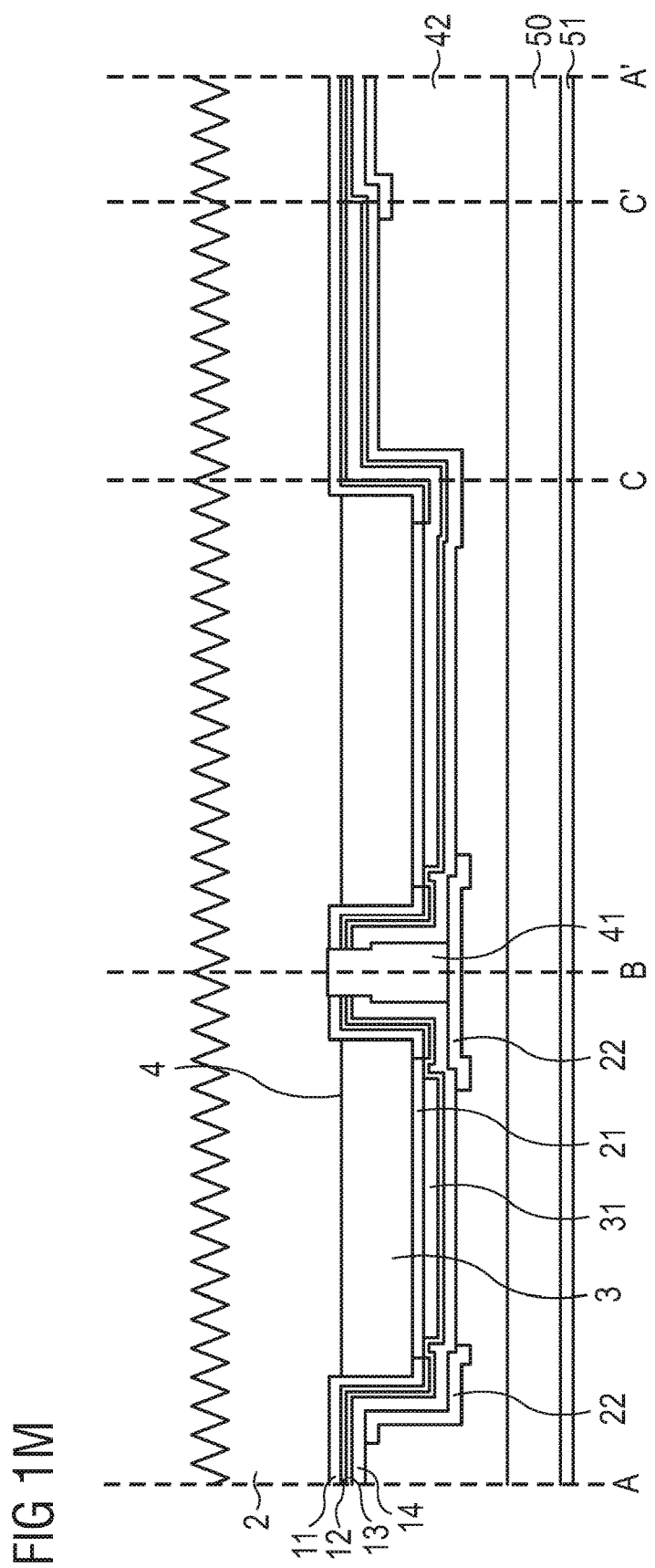
FIGS. 1A to 1Q show method steps for a method for producing an optoelectronic semiconductor chip as described here, FIG. 1Q being a schematic sectional representation of an optoelectronic semiconductor chip described here.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

FIG. 1A shows how first of all a growth substrate 1, for example, of sapphire, is provided, on which the semiconductor body 10 is deposited, in particular epitaxially. The semiconductor body 10 comprises the n-conductive region 2, the p-conductive region 3 and therebetween the active region 4. The growth substrate 1 is provided, for example, in the form of a wafer, wherein the broken lines A, A' specify the chip grid of the optoelectronic semiconductor chip to be produced. A through-via is produced along the broken line B during production. The broken lines C, C' reproduce the position of a contact region in which, for example, a bond pad is formed during production for contacting the optoelectronic semiconductor chip.

The semiconductor body 10 is based in the present case, for example, on a nitride compound semiconductor material.

In the following method step, FIG. 1B, the p-conductive region 3, the active region 4 and the n-conductive region 2 are patterned, for example, by etching the epitaxially deposited layers of the semiconductor body 10 to form an outer face of the semiconductor body 10 and a through-via. In the process the n-conductive region of the semiconductor body is exposed in places.

In the following method step 1C, the whole area of the outer face of the semiconductor body 10 remote from the growth substrate 1 is coated with a first encapsulation layer 11, which comprises an electrically insulating layer, for example, a layer produced using a CVD method. The first encapsulation layer 11 may take the form of an encapsulation layer sequence and comprise, for example, sublayers formed with $SiO_2$ and SiN. The sublayers are arranged one above the other in a vertical direction, perpendicular to the lateral direction. The lateral direction lies parallel to the plane of the main direction of extension, for example, of the growth substrate 1.

The sublayers formed with $SiO_2$ have a thickness, for example, of between 130 nm and 170 nm, in particular of 150 nm. The sublayers formed with SiN may have a thickness of between 10 nm and 14 nm, in particular of 12 nm. In particular, encapsulation layers are formed in this manner, which are also embodied to be particularly impermeable to materials which are used during the production of ALD layers.

The first encapsulation layer 11 completely covers the exposed side faces of the p-conductive region 3 and of the active region 4, such that in particular the pn junction of the semiconductor body and thus the active region 4 is protected by the first encapsulation layer 11.

In a next method step, FIG. 1D, a second encapsulation layer 12 is applied to the top of the first encapsulation layer 11 remote from the growth substrate 1. The second encapsulation layer 12 is an ALD layer.

The second encapsulation layer 12, which is an ALD layer, is produced using an ALD method, wherein the second encapsulation layer 12 may be deposited at least in places, for example, using ozone as precursor. In this case it is possible for the entire second encapsulation layer 12 to be deposited using ozone as precursor. It is moreover possible for the second encapsulation layer 12 to comprise at least two sublayers, which are, for example, arranged stacked on one another, wherein at least one of the sublayers is produced using an ALD method in which ozone is used as precursor.

It has been found that an ALD layer in which ozone is used as precursor displays particularly good impermeability relative to moisture. The layer or sublayer which is deposited with ozone as precursor is, for example, an $Al_2O_3$ layer or an $SiO_2$ layer or a $Ta_2O_5$ layer.

It is moreover possible for the second encapsulation layer 12 to comprise a sublayer or consist of a sublayer which is deposited using a precursor which does not contain ozone. In this case, for example, water or oxygen may be used as precursor material.

The second encapsulation layer 12 further comprises a further sublayer, which is, for example, deposited using a precursor which comprises ozone, wherein the second sublayer is deposited directly onto the sublayer. The first sublayer may, for example, have a thickness of between 5 and 10 nm. The second sublayer may then, for example, have a thickness of between 25 and 45 nm.

The second encapsulation layer 12 also at least indirectly covers the outer faces of the p-conductive region 3 and of the active region 4 of the semiconductor body. The first encapsulation layer and the second encapsulation layer together form an encapsulation layer sequence which extends on the outer face of the semiconductor body 10 from the active region 4 along the p-conductive region 3.

In the next method step, FIG. 1E, the encapsulation layer sequence is opened up using a photo method and a lift-off method and the first mirror layer 21, which is, for example, formed with silver, is deposited.

In the subsequent method step, FIG. 1F, a p-connection layer 31 is deposited on the first mirror layer 21 using a further photo method, the p-connection layer extending into the region C, C' of the optoelectronic semiconductor chip, in which a contact region 43 is subsequently formed for contacting the p-conductive region 3 of the optoelectronic semiconductor chip. The p-connection layer 31 does not here cover the first mirror layer 21 completely, but rather regions at the edge of the first mirror layer 21 remain free of the p-connection layer 31. The p-connection layer 31 may, for example, be formed by a Pt/Au/Ti layer stack, wherein the platinum layer is formed on the side of the layer stack facing the first mirror layer 21.

In conjunction with FIG. 1G, a further method step is described in which a third encapsulation layer 13 is applied to the exposed outer face of the second encapsulation layer 12, the first mirror layer 21 and the p-connection layer 31. The second encapsulation layer 12 and the third encapsulation layer 13 are in direct contact with one another in places in a region to the side of the first mirror layer 21. In this case, the third encapsulation layer 13 is also an ALD layer, which may be built up, for example, identically to the second encapsulation layer 12. The third encapsulation layer 13 extends over the entire top of the semiconductor body 10 remote from the growth substrate 1.

In conjunction with FIG. 1H, a method step is described in which a fourth encapsulation layer 14 is applied. The fourth encapsulation layer 14 is, for example, not an ALD layer and it may be of identical construction to the first encapsulation layer 11. The fourth encapsulation layer 14 completely covers the top of the third encapsulation layer 13 remote from the growth substrate 1 and, for example, conformally covers over the shape thereof.

In the following method step, FIG. 1I, a through-via 40 is produced in the region B by opening up the encapsulation layers 11, 12, 13, 14. In the through-via 40 the n-conductive region 2 is exposed. To remove the encapsulation layers, a photo method may be used, which is subsequently also used on introduction of the n-contact material 41 into the through-via 40.

In the region of the through-via 40, i.e., in the region B, the second encapsulation layer 12 and the third encapsulation layer 13, which are each ALD layers, directly adjoin one another. In particular, they are not separated from one another by a layer which, for example, contains silicon dioxide or consists of silicon dioxide, furthermore they are not separated from one another by a layer which is not an ALD layer. If the second encapsulation layer 12 and the third encapsulation layer 13 were separated from one another by such a layer, the etching process which is necessary for removing the encapsulation layers would be markedly more complex. In other words, because the two ALD layers, the second encapsulation layer 12 and the third encapsulation layer 13, directly adjoin one another, the through-via 40 may be produced in a particularly simple way.

In the next method step, FIG. 1J, n-contact material 41 is introduced into the through-via 40 in the region B. The n-contact material 41 is, for example, formed by a metal and may comprise materials such as titanium and/or gold.

In the next method step, FIG. 1K, a second mirror layer 22 is applied, which may, for example, be of identical construction to the first mirror layer 21. The second mirror layer 22 is arranged on the bottom of the n-contact material 41 remote from the n-conductive region 2, wherein encapsulation layers are arranged in places between the first mirror layer 21 and the second mirror layer 22. For example, the third encapsulation layer 13 and the fourth encapsulation layer 14 are arranged directly between the first mirror layer 21 and second mirror layer 22. The second mirror layer 22 may in places directly adjoin the fourth encapsulation layer 14. Lateral regions of the second mirror layer 22 project in lateral directions over the through-via 40 and the outer face of the semiconductor body 10, in particular of the p-conductive region 3.

In the next method step, FIG. 1L, first of all the metallic encapsulation layer 42 is applied, which covers over the topography remote from the growth substrate 1 and acts as a planarization layer. The metallic encapsulation layer 42 contains, for example, a Pt/Au/Ti layer sequence and serves as a diffusion barrier for material from the second mirror layer 22. The metallic encapsulation layer 42 may be used as a seed layer for subsequent application of a carrier 50 by electroplating. The carrier 50 may in this case be formed, for example, of copper. It is moreover possible that the carrier 50 is formed from silicon or germanium or another semiconductor material. On the side of the carrier 50 remote from the growth substrate 1, back metallization 51 may be arranged which makes the subsequent optoelectronic semiconductor chip solderable.

In the next method step, FIG. 1M, the growth substrate 1 is detached and the top of the n-conductive region 2 originally facing the growth substrate is roughened. The growth substrate 1 may be detached, for example, using a laser lift-off method, while the roughening is performed, for example, by lithographic etching with KOH.

In the following method step, mesa etching is performed. This etching stops at the first encapsulation layer 11. Thereafter, a hard mask 60, for example, of silicon dioxide, is applied to the n-conductive region 2.

FIG. 1O shows that the hard mask 60 is removed by dry chemical etching of the mask layer 60 and the first encapsulation layer 11. The thickness of the mask layer 60 is coupled to the thickness of the first encapsulation layer 11, resulting in an etch stop at the second encapsulation layer 12. The etch stop may take place, for example, by endpoint detection at, for example, the $Al_2O_3$ layer or the $Ta_2O_5$ layer of the second encapsulation layer 12.

The first encapsulation layer 11 is removed in the etching process. An important factor is that the etching process does not stop at the p-connection layer 31, i.e., for example, not at a platinum layer, but rather at the second encapsulation layer 12, which is formed with an electrically insulating material. The second encapsulation layer 12 is barely affected by the dry etching step used as a result of the lower selectivity thereof compared with etching on silicon dioxide and the thickness thereof is reduced, for example, by between 5 nm and 7 nm. Because no metals are affected during etching, there is no redeposition of detached metals, for example, onto the semiconductor body in the region of the active region 4. In this way, low current performance is improved and potential aging problems in relation to low current performance are reduced.

In the next method step, FIG. 1P, a fifth encapsulation layer 15 is applied, this being an ALD layer which may, for example, be of identical construction to the second encapsulation layer 12. In this case, contact points TP form between the second and fifth encapsulation layers, at which these two encapsulation layers are in direct contact with one another. The second encapsulation layer 12 comprises an etched surface in the region in direct contact with the fifth encapsulation layer 15 and is there reduced in thickness.

A sixth encapsulation layer 16, which is, for example, formed with silicon dioxide or consists of silicon dioxide, is subsequently applied to the side of the fifth encapsulation layer 15 remote from the carrier 50 for final passivation of the semiconductor body.

Figure 1Q:
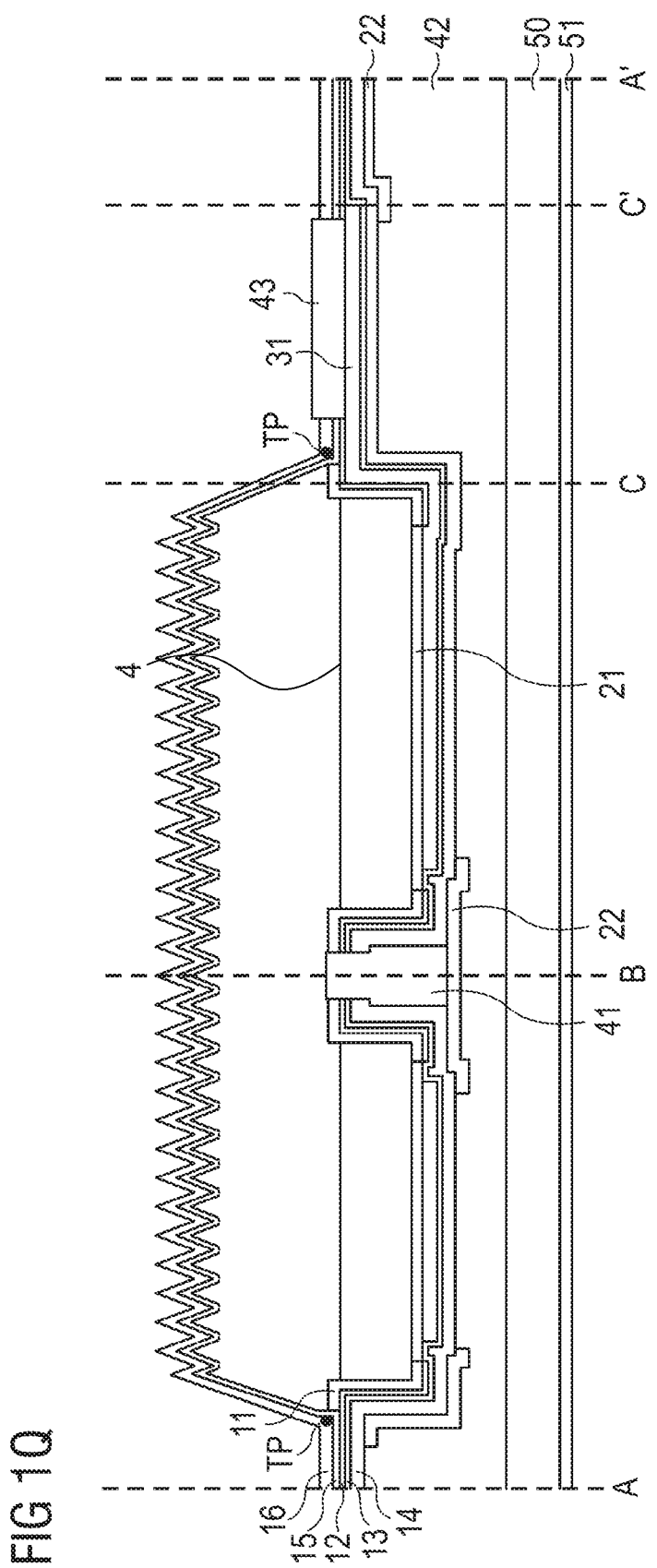

As described in conjunction with FIG. 1Q, the p-connection layer 31 is exposed and a contact region 43 which may, for example, be wire-contactable is deposited onto the p-connection layer 31.

Overall, an optoelectronic semiconductor chip is described in conjunction with FIG. 1Q which has the semiconductor body 10, which comprises the n-conductive region 2, the active region 4 provided to generate electromagnetic radiation and the p-conductive region 3, the first mirror layer 21, which is provided to reflect the electromagnetic radiation, the first encapsulation layer 11, which is formed with an electrically insulating material, the second encapsulation layer 12, which is formed with an electrically insulating material, and the third encapsulation layer 13, which is formed with an electrically insulating material, wherein the first mirror layer 21 is arranged on a bottom of the p-conductive region 3, the active region 4 is arranged on a side of the p-conductive region 3 remote from the first mirror layer 21, the n-conductive region 2 is arranged on a side of the active region 4 remote from the p-conductive region 3, the first, second and third encapsulation layers 11, 12, 13 cover the semiconductor body 10 in places on the outer face thereof, the third encapsulation layer 13 completely covers the first mirror layer 21 on the side thereof remote from the p-conductive region 3 and in places is in direct contact with the first mirror layer 21, the second encapsulation layer 12 and the third encapsulation layer 13 are in places in direct contact with one another in a region to the side of the first mirror layer 21, and the second encapsulation layer 12 and the third encapsulation layer 13 are ALD layers.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor chip comprising:
a semiconductor body, which comprises an n-conductive region, an active region configured to generate electromagnetic radiation and a p-conductive region, wherein the n-conductive region is arranged on a side of the active region remote from the p-conductive region;
a first mirror layer arranged on a bottom of the p-conductive region to reflect the electromagnetic radiation, wherein the active region is arranged on a side of the p-conductive region remote from the first mirror layer;
a first encapsulation layer comprising electrically insulating material;
a second encapsulation layer comprising electrically insulating material; and
a third encapsulation layer comprising electrically insulating material,
wherein the first, second and third encapsulation layers cover the semiconductor body in places on an outer face of the semiconductor body,
wherein the third encapsulation layer completely covers the first mirror layer on a side remote from the p-conductive region and, in places, is in direct contact with the first mirror layer,
wherein the second encapsulation layer and the third encapsulation layer are in places in direct contact with one another in a region spaced from the first mirror layer in a lateral direction,
wherein the first encapsulation layer is arranged between the p-conductive region and the second encapsulation layer in the lateral direction,
wherein the lateral direction is a direction extending parallel to a main plane of the first mirror layer, and
wherein the second encapsulation layer is arranged between the first encapsulation layer and the third encapsulation layer in the lateral direction.

2. The optoelectronic semiconductor chip according to claim 1, further comprising a second mirror layer arranged on a bottom of the third encapsulation layer remote from the semiconductor body, and wherein the second mirror layer projects in the lateral direction beyond the outer face of the semiconductor body.

3. The optoelectronic semiconductor chip according to claim 1, wherein the first encapsulation layer on the outer face of the semiconductor body extends from the active region along the p-conductive region to a side face of the first mirror layer, and wherein the first encapsulation layer is in direct contact with the first mirror layer.

4. The optoelectronic semiconductor chip according to claim 1, further comprising a fourth encapsulation layer completely covering the third encapsulation layer on a side remote from the semiconductor body and in direct contact with the third encapsulation layer in places.

5. The optoelectronic semiconductor chip according to claim 4, further comprising a second mirror layer arranged on an n-contact material remote from the n-conductive region, and wherein the third encapsulation layer and the fourth encapsulation layer are arranged, in places, between the first mirror layer and the second mirror layer.

6. The optoelectronic semiconductor chip according to claim 5, wherein the second mirror layer projects in the lateral direction beyond the outer face of the semiconductor body.

7. The optoelectronic semiconductor chip according to claim 5, wherein the second mirror layer extends beneath a contact region in places, wherein the second mirror layer is electrically insulated from the contact region at least by the third encapsulation layer, and wherein the contact region is provided for p-side connection of the semiconductor chip from outside the semiconductor chip.

8. The optoelectronic semiconductor chip according to claim 4, further comprising a fifth encapsulation layer, wherein the fifth encapsulation layer completely covers the outer face of the semiconductor body at the n-conductive region facing away from the active region, and wherein the fifth encapsulation layer is in direct contact with the second encapsulation layer in places to a side of the semiconductor body.

9. The optoelectronic semiconductor chip according to claim 8, wherein the second encapsulation layer is thinner in a region in contact with the fifth encapsulation layer than in a region in which there is no contact between the second encapsulation layer and the fifth encapsulation layer.

10. The optoelectronic semiconductor chip according to claim 8, further comprising a through-via that extends through the p-conductive region and the active region into the n-conductive region,
wherein the through-via comprises an n-contact material, by way of which the n-conductive region is electrically contacted, and
wherein, apart from the through-via, the semiconductor body is completely surrounded by the second encapsulation layer, the third encapsulation layer and the fifth encapsulation layer.

11. The optoelectronic semiconductor chip according to claim 10, wherein the first, second and third encapsulation layers directly adjoin the n-contact material in places.

12. The optoelectronic semiconductor chip according to claim 1, further comprising a through-via extending through the p-conductive region and the active region into the n-conductive region, wherein the through-via comprises an n-contact material, by way of which the n-conductive region is electrically contacted.

13. The optoelectronic semiconductor chip according to claim 12, further comprising:
a fourth encapsulation layer completely covering the third encapsulation layer on a side remote from the semiconductor body, wherein the fourth encapsulation layer is in direct contact with the third encapsulation layer in places; and
a fifth encapsulation layer, wherein the fifth encapsulation layer completely covers the outer face of the semiconductor body at the n-conductive region facing away from the active region, and wherein the fifth encapsulation layer is in direct contact with the second encapsulation layer in places to a side of the semiconductor body,
wherein apart from the through-via, the semiconductor body is completely surrounded by the second encapsulation layer, the third encapsulation layer and the fifth encapsulation layer, and
wherein the first, second, third and fourth encapsulation layers directly adjoin the n-contact material in places.

14. The optoelectronic semiconductor chip according to claim 1, wherein a distance between a side face of the first mirror layer and a side face of the n-conductive region in the lateral direction is at most 2.5 µm.

15. The optoelectronic semiconductor chip according to claim 1, wherein the p-conductive region and the first mirror layer are covered at their side faces in places by a metallic encapsulation layer, wherein an encapsulation layer sequence extends between the metallic encapsulation layer and the side faces of the p-conductive region and the first mirror layer.

16. The optoelectronic semiconductor chip according to claim 15, wherein the encapsulation layer sequence is formed by the first encapsulation layer and the second encapsulation layer.

17. The optoelectronic semiconductor chip according to claim 1, wherein the first, second and third encapsulation layers differ from one another with respect to their material composition.

18. An optoelectronic semiconductor chip comprising:
a semiconductor body, which comprises an n-conductive region, an active region provided to generate electromagnetic radiation and a p-conductive region, wherein the n-conductive region is arranged on a side of the active region remote from the p-conductive region;
a first mirror layer provided to reflect electromagnetic radiation, the first mirror layer being arranged on a bottom of the p-conductive region, wherein the active region is arranged on a side of the p-conductive region remote from the first mirror layer;
a second mirror layer provided to reflect electromagnetic radiation, wherein the second mirror layer projects in a lateral direction beyond an outer face of the semiconductor body;
a first encapsulation layer comprising an electrically insulating material and covering the semiconductor body in places on the outer face of the semiconductor body;
a second encapsulation layer comprising electrically insulating material and covering the semiconductor body in places on the outer face of the semiconductor body, wherein the second mirror layer is arranged on the first and second encapsulation layer remote from the semiconductor body; and
a third encapsulation layer comprising an electrically insulating material, wherein the second encapsulation layer and the third encapsulation layer are in places in direct contact with one another in a region to a side of the first mirror layer, wherein the first, second and third encapsulation layers cover the semiconductor body in places on the outer face thereof, and wherein the third encapsulation layer completely covers the first mirror layer on the side thereof remote from the p-conductive region and in places is in direct contact with the first mirror layer;
wherein the first encapsulation layer is arranged between the p-conductive region and the second encapsulation layer in a lateral direction, and
wherein the lateral direction is a direction extending parallel to a main plane of the first mirror layer.

19. The optoelectronic semiconductor chip according to claim 18, wherein the first and second encapsulation layers differ from one another with respect to their material composition.

* * * * *